(12) United States Patent
Tanaka

(10) Patent No.: US 10,656,444 B2
(45) Date of Patent: May 19, 2020

(54) OPTICAL MODULATOR

(71) Applicant: SUMITOMO ELECTRIC INDUSTRIES, LTD., Osaka (JP)

(72) Inventor: Keiji Tanaka, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 52 days.

(21) Appl. No.: 15/926,467

(22) Filed: Mar. 20, 2018

(65) Prior Publication Data

US 2018/0275434 A1 Sep. 27, 2018

(30) Foreign Application Priority Data

Mar. 21, 2017 (JP) ................. 2017-054748

(51) Int. Cl.
| | |
|---|---|
| *G02F 1/00* | (2006.01) |
| *G02B 26/00* | (2006.01) |
| *G02F 1/025* | (2006.01) |
| *H01L 23/64* | (2006.01) |
| *G02F 1/01* | (2006.01) |
| *G02F 1/015* | (2006.01) |

(52) U.S. Cl.
CPC ............ *G02F 1/025* (2013.01); *G02F 1/0121* (2013.01); *G02F 1/0123* (2013.01); *H01L 23/64* (2013.01); *G02F 2001/0157* (2013.01)

(58) Field of Classification Search
CPC ...... G02F 1/0121; G02F 1/025; G02F 1/0356; G02F 1/0344; G02F 1/2255; G02F 2001/0157; G02F 2201/127; G02F 2201/16

USPC ............................ 359/238–279; 385/1–9, 14
See application file for complete search history.

(56) References Cited

U.S. PATENT DOCUMENTS 7,899,276 B2 * 3/2011 Kucharski ............... G02F 1/025
385/14

FOREIGN PATENT DOCUMENTS

| JP | 2001-257412 | 9/2001 |
|---|---|---|
| JP | 2001-308130 | 11/2001 |
| JP | 2002-350792 | 12/2002 |
| JP | 2015-125153 | 7/2015 |

* cited by examiner

*Primary Examiner* — Mahidere S Sahle
(74) *Attorney, Agent, or Firm* — Smith, Gambrell & Russell, LLP

(57) ABSTRACT

An optical modulator implementing an electro-absorption (EA) modulator is disclosed. The optical modulator includes a transmission line, a terminator, an EA modulator, a bonding wire, and a coil element. The transmission line transmits an electrical signal. The terminator terminates the transmission line. The coil element includes first and second inductors magnetically coupled with each other, where the first inductor is connected with the transmission line, while, the second inductor is connected with the terminator. The bonding wire connects the first and second inductors with the EA modulator. The impedance of the coil element as viewed from the transmission line substantially matches with the impedance of the transmission line.

17 Claims, 19 Drawing Sheets

Fig. 18

$$M = k\sqrt{L_{in}L_{out}} \quad (1)$$

$$Z_{in}(s) = R_T \frac{1 + \frac{2(1+k)L_T}{R_T}s + \{C_{EA}(L_{EA}+L_T)+2C_B L_T(1+k)\}s^2 + \frac{C_{EA}L_T(1+k)\{2L_{EA}+L_T(1-k)\}}{R_T}s^3 + C_B C_{EA}L_T(1+k)\{2L_{EA}+L_T(1-k)\}s^4}{1 + C_{EA}R_T s + \{C_{EA}(L_{EA}+L_T)+2C_B L_T(1+k)\}s^2 + 2C_B C_{EA}L_T(1+k)L_T R_T s^3 + C_B C_{EA}L_T(1+k)\{2L_{EA}+L_T(1-k)\}s^4} \quad (2)$$

$$L_T = \frac{C_{EA}R_T^2}{2(1+k)} \quad (3)$$

$$C_B = \frac{C_{EA}(1-k)}{4(1+k)} + \frac{L_{EA}}{R_T^2} \quad (4)$$

$$v_{EA}(s) = \frac{1 + \frac{(1+k)L_T}{R_T}s + 2C_B L_T(1+k)s^2}{1 + \frac{2(1+k)L_T}{R_T}s + \{C_{EA}(L_{EA}+L_T)+2C_B L_T(1+k)\}s^2 + \frac{C_{EA}L_T(1+k)\{2L_{EA}+L_T(1-k)\}}{R_T}s^3 + C_B C_{EA}L_T(1+k)\{2L_{EA}+L_T(1-k)\}s^4} v_{in}(s)$$

$$= \frac{1 + \frac{(1+k)L_T}{R_T}s + 2C_B L_T(1+k)s^2}{\{1 + \frac{(1+k)L_T}{R_T}s + 2C_B L_T(1+k)s^2\}\{1 + \frac{C_{EA}R_T}{2}s + C_{EA}(L_{EA}+\frac{1-k}{2}L_T)s^2\}} v_{in}(s)$$

$$= \frac{1}{1 + \frac{C_{EA}R_T}{2}s + C_{EA}(L_{EA}+\frac{1-k}{2}L_T)s^2} v_{in}(s)$$

$$= \frac{1}{1 + \frac{C_{EA}R_T}{2}s + \{C_{EA}L_{EA}+\frac{1-k}{4(1+k)}C_{EA}^2 R_T^2\}s^2} v_{in}(s) \quad (5)$$

Fig. 19

$$v_{EA}(s) = \cfrac{1}{1 + \cfrac{C_{EA}R_T}{2}s + \left(C_{EA}L_{EA} + \cfrac{1-k}{4(1+k)}C_{EA}^2 R_T^2\right)s^2} v_{in}(s)$$

$$= \cfrac{1}{1 + \cfrac{1}{\omega_1 Q_1}s + \cfrac{1}{\omega_1^2}s^2} v_{in}(s) \qquad (6)$$

$$\omega_1 = \cfrac{1}{\sqrt{C_{EA}L_{EA} + \cfrac{1}{\omega_0^2}}} \qquad (7)$$

$$Q_1 = \sqrt{4\cfrac{1}{C_{EA}R_T}\cfrac{L_{EA}}{R_T} + Q_0^2} \qquad (8)$$

$$\omega_0 = \cfrac{2\sqrt{1+k}}{\sqrt{1-k}}\cfrac{1}{C_{EA}R_T} \qquad (9)$$

$$Q_0 = \cfrac{2}{C_{EA}R_T\omega_0} = \cfrac{\sqrt{1-k}}{\sqrt{1+k}} \qquad (10)$$

$$f_{3dB} = \cfrac{\omega_1}{2\sqrt{2}\pi Q_1}\sqrt{2Q_1^2 - 1 + \sqrt{1 + 4Q_1^2(2Q_1^2 - 1)}} \qquad (11)$$

$$v_{EA}(s) = \cfrac{1 + \cfrac{L_{out}}{R_T}s}{1 + \cfrac{L_{in} + L_{out}}{R_T}s + C_{EA}L_{in}s^2 + \cfrac{C_{EA}L_{in}L_{out}}{R_T}s^3} v_{in}(s) \qquad (12)$$

$$|S_{11}| = -20\log_{10}\cfrac{Z_{in}(s) - 50}{Z_{in}(s) + 50} \qquad (13)$$

$$L_{in} = L_T \times (1 + KK) \qquad (14)$$

$$L_{out} = L_T \times (1 - KK) \qquad (15)$$

OPTICAL MODULATOR

CROSS REFERENCE TO RELATED APPLICATION

The present application is based on and claims the benefit of priority of Japanese Patent Application No. 2017-054748, filed on Mar. 21, 2017, the entire content of which is incorporated herein by reference.

BACKGROUND OF INVENTION

1. Field of Invention

An exemplary embodiment of the present invention relates to an optical modulator, in particular, an optical modulator implementing an electro-absorption (EA) modulator.

2. Related Background Arts

Development of advanced optical communication system eagerly requests the transmission speed of the optical signals to be further faster. An optical device, which is often called as electro-absorption (EA) modulator, is one of promising devices to be implemented in such an advanced optical communication system for modulating an optical signal. An EA modulator is monolithically integrated with a laser diode type of distributed feedback laser diode (DFB-LD) to constitute an optical modulator called as an electo-absorption modulator integrated with DFB laser diode (EML). An EML may modulate continuous wave (CW) light provided from the DFB-LD by partially absorbing/transmitting the CW light.

The EA modulator, which is intrinsically made of semiconductor materials, has semiconductor layers each having conduction type different from each other, which is inevitably attributed with junction capacitance. Viewing the EA modulator from a driver that drives the EA modulator, the EA modulator operates as a capacitive load. In order to generate light modulated in considerably high speed, the advanced optical communication system requires an EA modulator with smaller capacitance. For instance, in a case that the system implements the transmission speed of 10 to 40 Gbps, an EA modulator with junction capacitance of 0.2 to 0.5 pF is often applied. However, such junction capacitance often degrades an operable bandwidth of an EA modulator and/or causes a large reflective coefficient at an input of the EA modulator. Prior patent documents, such as Japanese Patents laid open Nos. JP-2001-257412A, JP-2001-308130A, JP-2002-350792A, JP-2015-125153A, and so on have disclosed techniques to suppress degradations in the frequency bandwidth and the signal reflective coefficient by connecting an EA modulator with a terminator that terminates a transmission line through an inductive bonding wire. Inductance attributed to the bonding wire may cancel or improve appearance of the junction capacitance of the EA modulator.

However, as the transmission speed to be handled in the advanced optical communication system becomes faster and faster, signal reflective coefficient (or return loss) at the input of an EA modulator has been requested to be further reduced without degrading the frequency bandwidth.

SUMMARY OF INVENTION

An aspect of the present invention relates to an optical modulator that includes a transmission line, an electro-absorption (EA) modulator, a terminator, and a coil element. The transmission line transmits an electrical signal. The EA modulator generates an optical signal that is modulated based on the electrical signal. The terminator terminates the transmission line and has impedance substantially equal to impedance of the transmission line. The coil element includes first and second inductors connected in series to each other. The first inductor connects the transmission line with the EA modulator, while, the second inductor connects the terminator with the EA modulator. The first and second inductors are magnetically coupled through mutual inductance therebetween. A feature of the optical modulator thus arranged is that the coil element, the terminator, and the EA modulator cause impedance of the coil element viewing from the transmission line to match with the impedance of the terminator.

BRIEF DESCRIPTION OF THE DRAWINGS

The foregoing and other purposes, aspects and advantages will be better understood from the following detailed description of a preferred embodiment of the invention with reference to the drawings, in which:

FIG. 18 shows equations 1 to 5; and

FIG. 19 shows equations 6 to 15.

DESCRIPTION OF EMBODIMENTS

Next, some embodiments according to the present invention will be described as referring to accompanying drawings. However, the present invention is not restricted to those embodiments and has a scope defined in claims and equivalents thereto. Also, in the description of the drawings, numerals or symbols same with or similar to each other will refer to elements same with or similar to each other without duplicating explanations.

Figure 1:
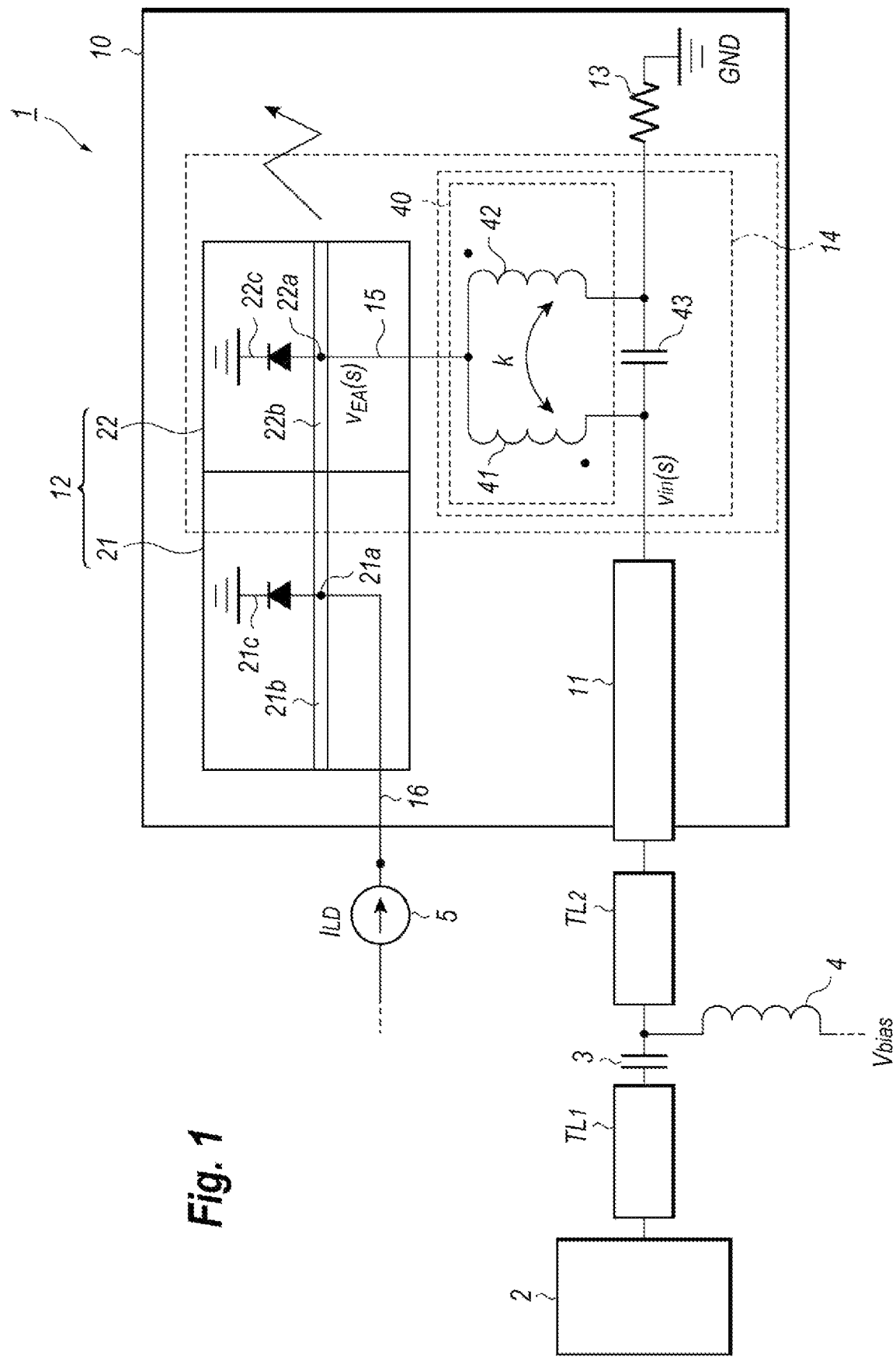
FIG. 1 shows a functional block diagram of an optical transmitter that implements an optical modulator according to the first embodiment of the present invention.

FIG. 1 shows a functional block diagram of an optical transmitter 1 according to a first embodiment of the present invention, where the optical transmitter 1 implements an optical modulator 10. The optical transmitter 1 provides a driver 2, a capacitor 3, an inductor 4, a current source 5, the optical modulator 10, and two transmission lines, $TL_1$ and $TL_2$. The driver 2, which may be a type of integrated circuit (IC), electrically drives the optical modulator 10 by providing a modulation signal. The capacitor 3 blocks direct current (DC) and low frequency (LF) components contained in the modulation signal coming from the driver 2. Thus, the optical modulator 10 may couple with the driver 2 in an alternating current (AC) mode. The transmission lines, $TL_1$ and $TL_2$, have preset characteristic impedance. Specifically, the modulation signal generated in the driver 2 may be carried on the first transmission line $TL_1$, cut in the DC and LF components thereof by the capacitor 3, superposed with a bias signal $V_{bias}$ provided through the inductor 4, then provided to the optical modulator 10. The inductor 4 in one of ends thereof is coupled with the bias source $V_{bias}$; while, the other end is coupled with the optical modulator 10 through the transmission line $TL_2$. The inductor 4, as descried above, may superpose the bias signal $V_{bias}$ on the modulation signal passing through the capacitor 3. The transmission lines, $TL_1$ and $TL_2$, may be provided on a substrate, or for example a circuit board made of glass-epoxy. The current source 5 may provide a bias current $I_{LD}$ to the optical modulator 10. One of terminals of the current source 5 is connected with a power supply, while, the other of the terminals is connected with the bonding wire 16.

Figure 2:
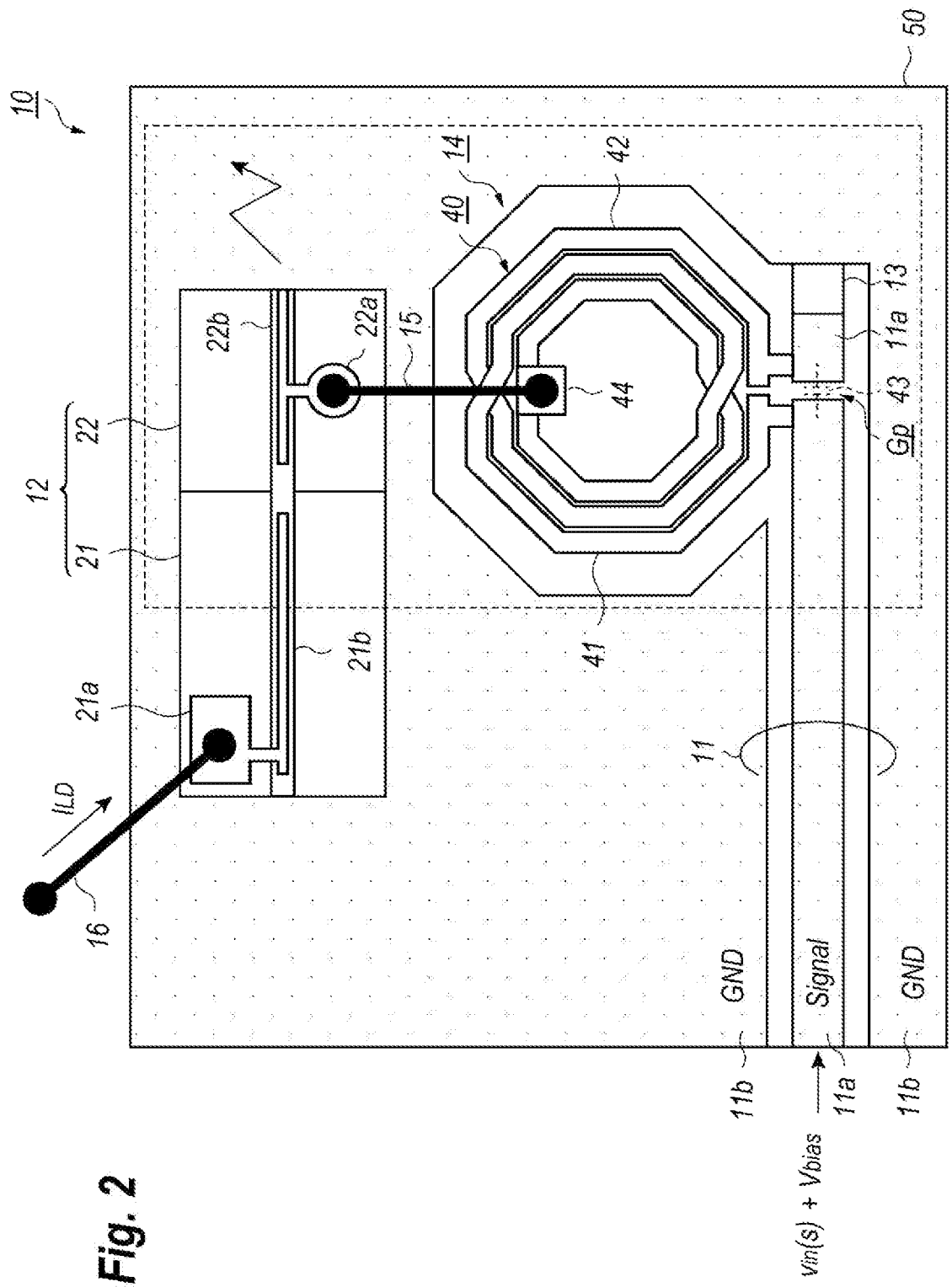
FIG. 2 schematically shows a configuration of the optical modulator shown in FIG. 1.

The optical modulator 10 modulates continuous wave (CW) light provided thereto by the modulation signal coming from the driver 2 and outputs the modulated light as an optical signal. The operation of the optical modulator 10 will be further described as referring to FIG. 2, where FIG. 2 shows a configuration of the optical modulator 10 according to the first embodiment of the present invention. The optical modulator 10 includes a transmission line 11, an Electro-absorption Modulator integrated with Distributed Feedback Laser diode 12, which is often called as EML, a terminator 13, a coil element 14, and an a bonding wire 15, where those elements are formed on a carrier 50 made of multi-layered circuit board. In an alternative, the carrier 50 may be made of aluminum nitride (AlN) for taking account of heat dissipation from the EML 12, in particular, that generated in a distributed feedback laser diode (DFB-LD), and dielectric loss of the transmission line 11.

The transmission line 11, which is electrically coupled with the driver 2 through the transmission lines, $TL_1$ and $TL_2$, and the capacitor 3, is electrically connected with the coil element 14. The transmission line 11 has characteristic impedance that is substantially equal to impedance $R_T$ of the terminator 13, specifically, which may be 45 to 55Ω in the first embodiment. The transmission line 11 has a type of micro-strip line comprising a signal line 11a and ground lines (ground patterns) 11b sandwiching the signal line 11a therebetween with a preset gap therebetween. The signal line 11a linearly extends from an end of the carrier 50 to the coil element 14.

The EML 12, which is mounted on the carrier 50, includes the DFB-LD 21 and an EA modulator 22 monolithically provided on a substrate common to the respective elements, 21 and 22. The DFB-LD 21 has a type of, what is called, distributed feedback laser diode, that provides an anode electrode 21a, a waveguide 21b, and a cathode electrode 21c, where the cathode electrode 21c is provided in a back surface of the DFB-LD 21 facing to and in contact with the ground surface GND on the top of the carrier 50; while a bonding wire 16 is connected to the anode electrode 21a. The DFB-LD 21, which is biased in forward to be supplied with a bias current $I_{LD}$, may cause a laser oscillation to generate continuous wave (CW) light and provides this CW light to the EA modulator 22 through the waveguide 21b.

The EA modulator 22, which has a type of electro-absorption (EA) modulator, may modulate the CW light provided from the DFB-LD 21 by the modulation signal. The EA modulator 22 provides an absorption layer made of semiconductor material and reversely biased between two doped semiconductor layers with respective conduction types opposite to each other. Accordingly, the EA modulator 22 may be regarded as a reversely biased diode inherently attributed with junction capacitance $C_{EA}$. The EA modulator 22 provides an anode electrode 22a, a waveguide 22b, and a cathode electrode 22c, where the cathode electrode 22c is provided in a back surface of the EA modulator 22 facing to and in contact with the ground surface GND provided on the top of the carrier 50. The anode electrode 22a receives the modulation signal through the bonding wire 15 connected thereto. The waveguide 22b optically couples with the waveguide 21b in the DFB-LD 21 to receive the CW light generated in the DFB-LD 21. Because the anode electrode 21a receives a bias signal $V_{bias}$ superposed on the modulation signal $v_{mod}$, the EA modulator 21, specifically, the absorption layer thereof is negatively biased. The modulation signal $v_{mod}$ superposed on the bias signal $V_{bias}$, may modulate the absorbance in the absorption layer. Specifically, when the absorption layer is deeply biased by a lower bias signal $V_{bias}$, for example −2.0V, the absorption co-efficient therein increases to reduce transmission therethrough and the light output from the EA modulator 22 decreases in magnitude thereof. On the other hand, when the absorption layer is shallowly biased by a higher bias signal $V_{bias}$, for example −1.0V, the absorption of the CW light decreases and the light output from the EA modulator 22 increases in the magnitude thereof. The light output from the EA modulator 22 is optically coupled with an optical fiber through an optical coupling system, which are in not illustrated in figures.

The terminator 13 is a resistive element, which has impedance $R_T$ thereof substantially equal to characteristic impedance of the transmission line 11, may terminate the transmission line 11a. The first embodiment has the impedance $R_T$ of the terminator 13 to be set to a value from 45 to 55Ω. The terminator 13 in one end thereof is electrically connected with the coil element 14, while, another end is grounded.

The coil element 14 connects both the transmission line 11a and the terminator 13 with the EA modulator 22 to provide the modulation signal $v_{in}(s)$ output from the transmission line 11 to the EA modulator 22. The coil element 14 includes a transformer 40 comprised of a first inductor 41 and a second inductor 42 magnetically coupled to each other, where the first inductor 41 is put between the transmission line 11a and the anode electrode 22a, while, the second inductor 42 is put between the terminator 13 and the anode electrode 22a.

Specifically, two inductors, 41 and 42, in respective one ends are connected to each other at a tap 44 and the tap 44 is connected with the anode electrode 22a of the EA modulator 22 through the bonding wire 15; while, in respective another ends are coupled through a coupling capacitor 43 with capacitance $C_B$; that is, the inductors, 41 and 42, in respective another ends are coupled to each other in the alternating current (AC) mode. The two inductors, 41 and 42, constitute the transformer 40 with inductive coupling factor k. The bonding wire 15 inherently has inductance $L_{EA}$.

Referring to FIG. 2, the two inductors, 41 and 42, consitute a type of spiral inductor. The signal line 11a of the transmission line 11 extends from an input end of the optical modulator 10 to the terminator 13 on the carrier 50, then divided into two parts with a gap $G_p$. One of ends of the signal line 11a facing the gap $G_p$ is connected with the first inductor 41, while, one of the ends of the other signal line (a portion between the gap $G_p$ and the terminator 13) is connected with the second inductor 42. The gap $G_p$ inherently causes the coupling capacitor 43 with the capacitance $C_B$. The optical modulator 10 according to the first embodiment, as described later in this specification, positively forms the capacitance $C_B$ and utilizes for driving the EA modulator 22. For example, when the two inductors 41 and 42 need a coupling capacitor with a relatively small capacitance which depends on shape and dimensions of the two inductors 41 and 42, the coupling capacitor 43 may be a parasitic capacitor.

The two inductors, 41 and 42, provide a common tap 44 in the ends thereof, to which the bonding wire 15 is connected, and have plane shapes of line symmetry with respect to a virtual line extending the bonding wire 15. Also, the coil element 14 has input impedance $Z_{in}(s)$ viewed from the end of the transmission line 11 that is substantially matched with the impedance $R_T$ of the terminator 13.

Figure 3:
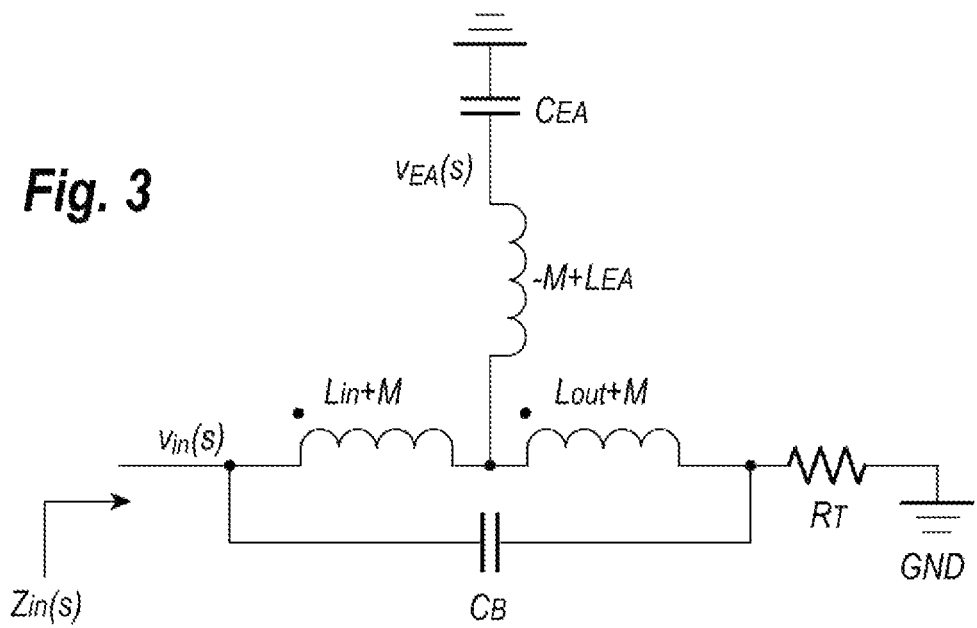
FIG. 3 shows an equivalent circuit of an inductor and circuit elements around the inductor.

Next, an equivalent circuit of the terminator 13, the coil element 14, and the EA modulator 22 viewed from the transmission line 11 will be described. FIG. 3 shows an equivalent circuit diagram around the coil element 14. Because the two inductors, 41 and 42, are magnetically coupled with the inductive coupling factor k; mutual inductance M therebetween is denoted as an equation (1) in FIG. 18, where $L_{in}$ and $L_{out}$ in the equation (1) are self-inductance of the inductors, 41 and 42, respectively.

Referring to FIG. 3, the mutual inductance M is negatively connected with the junction capacitance $C_{EA}$ of the EA modulator 22 from the tap 44. Accordingly, the inductance viewing the EA modulator 22 from the tap 44 becomes $-M+L_{EA}$ combined with the inductance attributed to the bonding wire 15. The inductance of the inductor 41 becomes $L_{in}+M$, while, that of the other inductor 42 becomes $L_{out}+M$. In order to simplify the configuration and the explanation thereof, a condition of $L_{in}=L_{out}=L_T$ is assumed. Carrying out the delta-star transformation for the delta configuration shown in FIG. 3; the input impedance $Z_{in}(s)$ viewing the EA modulator 22 from the transmission line 11 is given by an equation (2) in FIG. 18.

As shown in equation (2), numerator and denominator in $Z_{in}(s)$ may be denoted by polynomials of the complex frequency s. Also, terms having even orders (including zero) for the complex frequency in the numerator are equal to terms having the same even orders in the denominator. For example, the numerator and the denominator have the same number 1 as the respective zero order terms. In order to equalize the impedance $Z_{in}(s)$ to the impedance $R_T$ of the terminator 13, namely, $Z_{in}(s)/R_T=1$, terms with the first order for the complex frequency s becomes equal to each other in the numerator and the denominator, which results in an equation (3) in FIG. 18. Similarly, terms with the third order for the complex frequency s also become equal to each other in the numerator and the denominator, which gives a relation shown in equation (4) in FIG. 18.

That is, when the inductance $L_T$ and the capacitance $C_B$ satisfy the equation (3) and equation (4), respectively, the nominator becomes equal to the denominator in equation (2), and the input impedance $Z_{in}(s)$ may be given by the impedance $R_T$, which is independent of the complex frequency s. That is, the capacitance $C_B$ and the self-inductance $L_T$ of the inductors, 41 and 42, are set so as to satisfy the equations, (3) and (4), respectively, the input impedance $Z_{in}(s)$ becomes equal to the impedance $R_T$ independent of the frequency, which means that the optical modulator 10 shows substantially no reflection in the input port thereof because the transmission line 11 in the characteristic impedance thereof is equal to the impedance $R_T$.

The modulation signal $v_{EA}(s)$ appearing in the anode 22a of the EA modulator 22 is, based on the equivalent circuit shown in FIG. 3, given by an equation (5) in FIG. 18 using the modulation signal $v_{in}(s)$ provided from the transmission line 11.

Re-writing the equation (5) into a general form for the second order response using angular frequency $\omega_1$ and Q-factor $Q_1$, an equation (6) shown in FIG. 19 is derived, where $\omega_1$ and $Q_1$ are given by equations, (7) and (8) in FIG. 19, respectively. In the equations, (7) and (8), $\omega_0$ and $Q_0$ are given by equations, (9) and (10) in FIG. 19.

From equation (6), a frequency at which the modulation signal $v_{EA}(s)$ in the amplitude thereof becomes $1/\sqrt{2}$ with respect to that in low frequencies, which is often called as a 3 dB bandwidth ($f_{3\,dB}$), is given by an equation (11).

Figure 4:
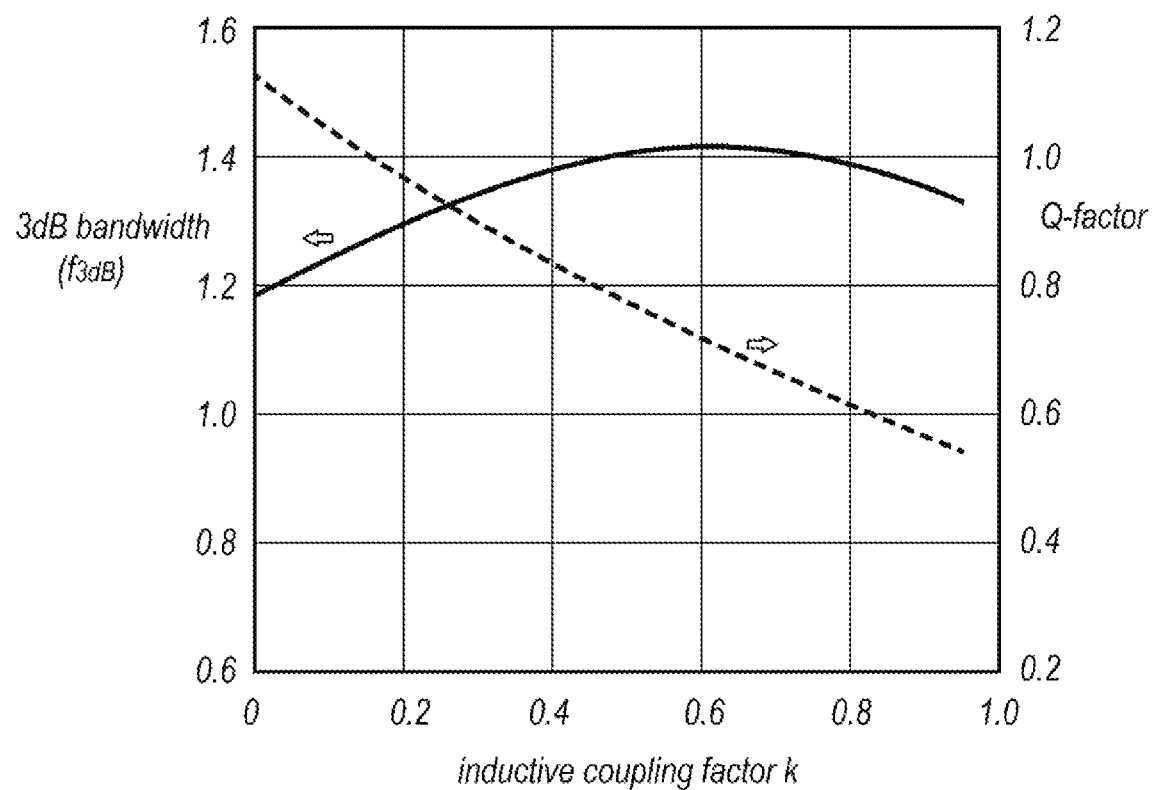
FIG. 4 shows behaviors of a normalized 3 dB bandwidth $f_{3\ dB}$ and a Q-factor against the inductive coupling factor k between two inductors in a coil element.

FIG. 4 shows behaviors of a 3 dB bandwidth with respect to the modulation signal $v_{EA}(s)$ appearing on the EA modulator 22 and the Q-factor against the inductive coupling factor k, where the 3 dB bandwidth $f_{3\,dB}$ is normalized by a reference frequency given by $1/(\pi R_T C_{EA})$ that corresponds to an arrangement where no coil element 14 is provided. That is, the frequency response of the circuit may be determined by a half of the impedance $R_T/2$ of the terminator 13 and the junction capacitance $C_{EA}$ of the EA modulator 22. In FIG. 4, the 3 dB bandwidth $f_{3\,dB}$ and the Q-factor were calculated based on the equations (3) and (4) for conditions of, $C_{EA}=0.3$ pF, $R_T=50Ω$, and $L_{EA}=50$ pH, respectively.

As shown in FIG. 4, the 3 dB bandwidth $f_{3\,dB}$ becomes a maximum when the inductive coupling factor k becomes around 0.6. Because the inductance $L_{EA}$ attributed to the bonding wire 15 may be cancelled by the mutual inductance M, the inductive coupling factor k that causes the 3 dB bandwidth $f_{3\ dB}$ to be a maximum approaches to the unity 1, when the inductance $L_{EA}$ becomes larger. That is, the inductive coupling factor k may be set depending on the inductance $L_{EA}$ of the bonding wire 15. Also, based on the equations, (8) and (10), the Q-factor becomes larger as the inductive coupling factor k becomes smaller.

Figure 5:
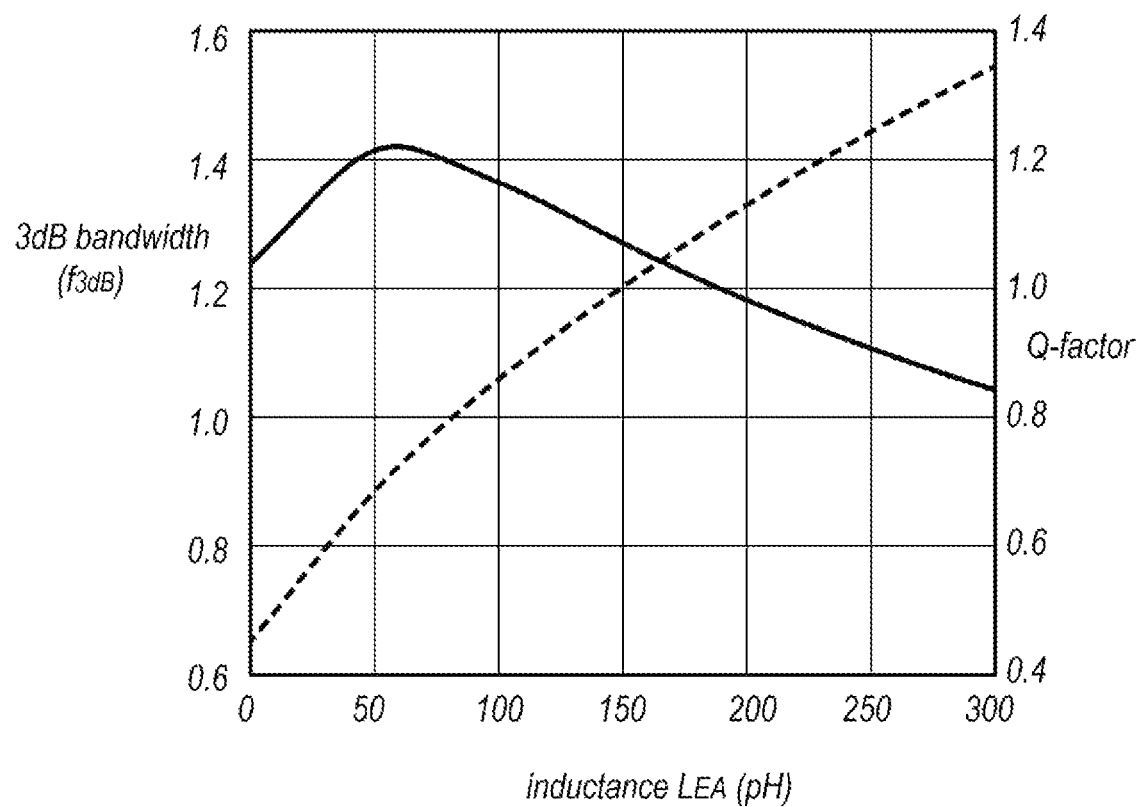
FIG. 5 shows behaviors of the normalized 3 dB bandwidth $f_{3\ dB}$ and the Q-factor against inductance of a bonding wire connecting the coil element with the EA modulator.
Figure 6:
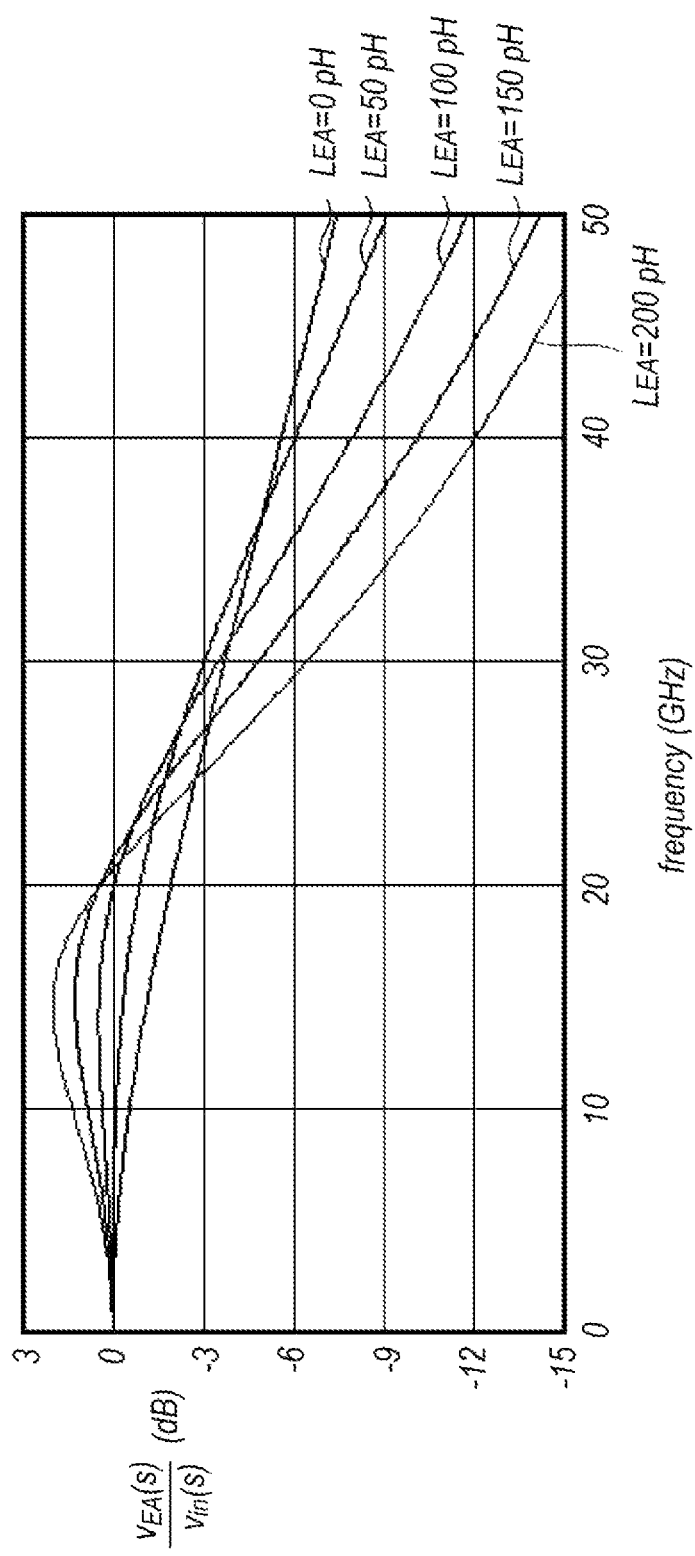
FIG. 6 shows frequency responses of the modulation signal at the EA modulator with the inductance of the bonding wire as a parameter.

FIG. 5 shows the 3 dB bandwidth $f_{3\ dB}$ with respect to the modulation signal $v_{EA}(s)$ appearing at the EA modulator 22 and the Q-factor against the inductance $L_{EA}$ of the bonding wire 15; while, FIG. 6 shows frequency responses of the modulation signal $v_{EA}(s)$. The vertical axes in FIG. 5 denote the 3 dB bandwidth $f_{3\ dB}$ and the Q-factor, while, the horizontal axis thereof shows the inductance $L_{EA}$ of the bonding wire 15. The vertical axis in FIG. 6 shows a ratio of the modulation signal $v_{EA}(s)$ at the EA modulator 22 against the modulation signal $v_{in}(s)$ at the end of the transmission line 11, namely, at the input of the coil element 14; while the horizontal axis shows the frequency. Calculations in the equations (3), (4), and (5) assumed that the capacitance $C_{EA}$, the impedance $R_T$ of the terminator 13, and the inductive coupling factor k are 0.3 pF, 50Ω, and 0.66, respectively. As shown in FIG. 5 and FIG. 6, when the inductance $L_{EA}$ becomes greater than 60 pH; the 3 dB bandwidth becomes smaller while the Q-factor becomes greater, in particular, the 3 dB bandwidth $f_{3\ dB}$ is greater than 1.35 for the inductance $L_{EA}$ of 30 to 110 pH.

Figure 7:
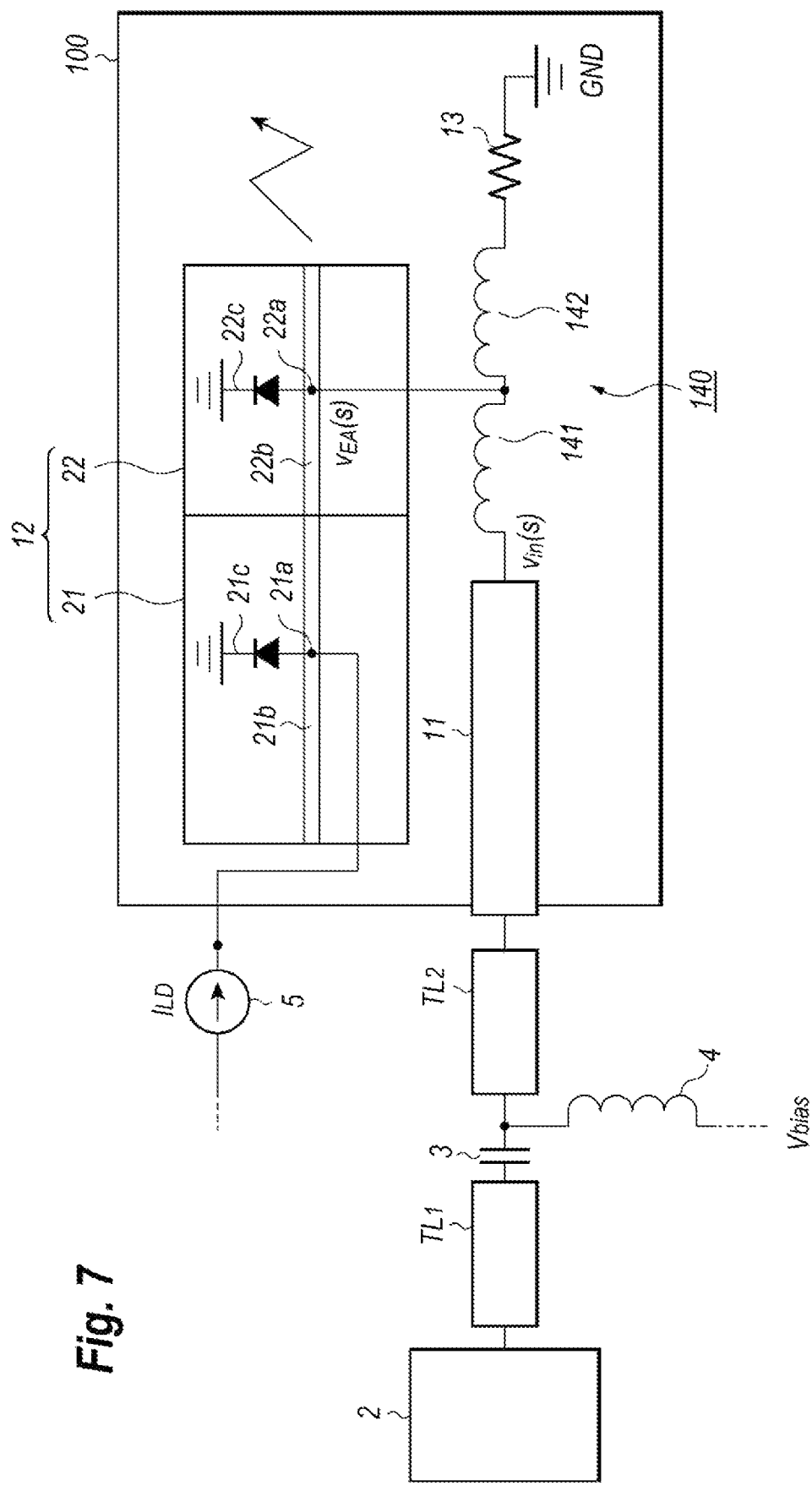
FIG. 7 shows a functional block diagram of a conventional optical transmitter that implements an optical modulator with no coil element.

Advantages of the optical modulator 10 according to the first embodiment of the present invention will be described as comparing the optical modulator 10 with a conventional one. FIG. 7 shows a functional block diagram of the conventional optical modulator 100 that is distinguishable from the optical modulator 10 of the first embodiment that the conventional modulator 100 provides a coil element 140, instead of the coil element 14 of the first embodiment. The coil element 140 includes bonding wires, 141 and 142, where they are replaced from the inductors, 41 and 42, in the coil element 14. The bonding wires, 141 and 142, have inductance, $L_{in}$ and $L_{out}$, substantially equal to the self-inductance of the inductors, 41 and 42, but show substantially no magnetic coupling therebetween. That is, the inductive coupling factor k between two bonding wires, 141 and 142, may be ignorable. Also, the two bonding wires, 141 and 142, cause substantially no coupling capacitance therebetween.

Assuming conditions that the transmission line 11 in the impedance thereof is completely matched with the impedance $R_T$ of terminator 13, and the transmission line 11 causes no loss, the modulation signal $v_{EA}(s)$ appearing in the EA modulator 22 is given by an equation (12) in FIG. 19.

Figure 8:
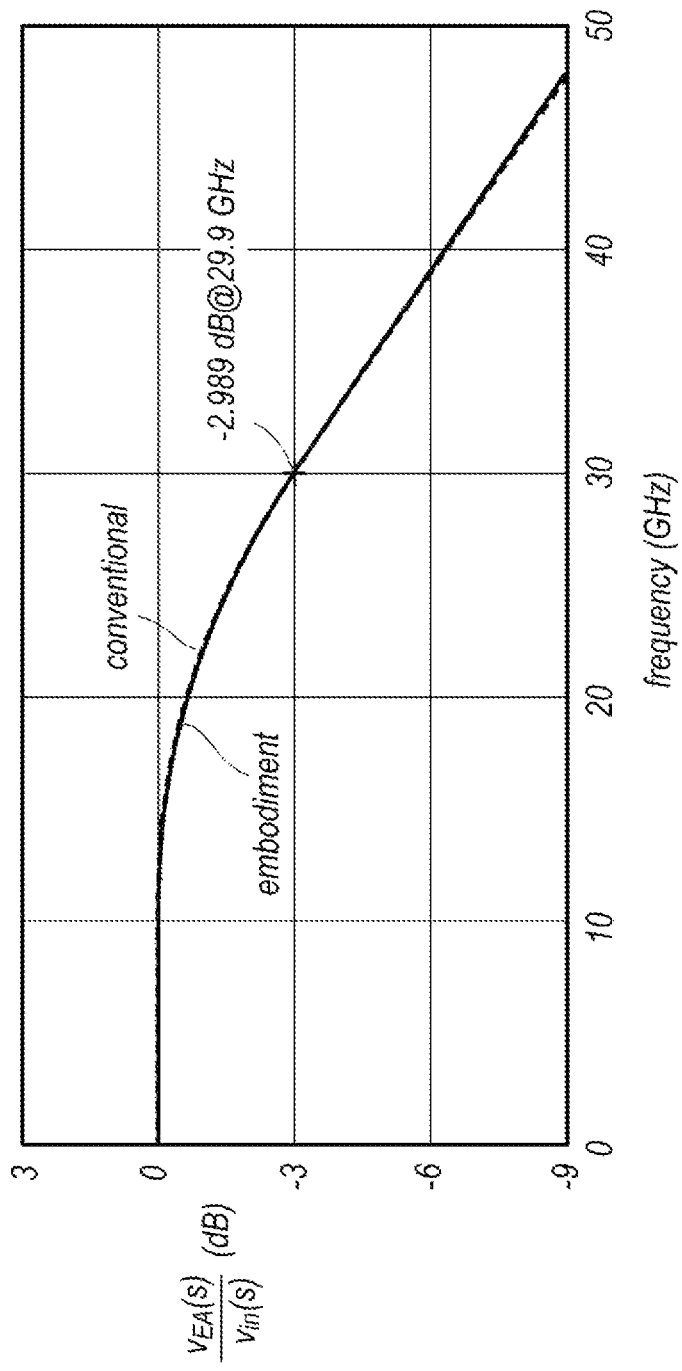
FIG. 8 compares the frequency response of the modulation signal in the optical modulator of the present invention with that of the conventional optical modulator.

FIG. 8 compares the frequency responses of the optical modulator 10 of the first embodiment shown in FIG. 1 with the conventional optical modulator 100 shown in FIG. 7. In the calculation of equations (3), (4), (5), and (12), the junctional capacitance $C_{EA}$, the impedance $R_T$ of the terminator 13, the inductance $L_{EA}$ of the bonding wires, 141 and 142, and the inductive coupling factor k were assumed to be 0.3 pF, 50Ω, 50 pH, and 0.66, respectively.

As shown in FIG. 8, the optical modulators, 10 and 100, show substantially equivalent 3 dB bandwidth $f_{3\ dB}$ that is around 30 GHz. The intrinsic bandwidth determined by the junction capacitance $C_{EA}$ and the impedance $R_T$ of the terminator 13 becomes $1/(\pi R_T C_{EA})$=21.2 GHz for the conditions above assumed. Because the modulation performance of the optical modulators, 10 and 100, may be each given by the second order transfer function of equations (6) and (12) shown in FIG. 19, the optical modulators, 10 and 100, show the 3 dB bandwidth $f_{3\ dB}$ that is multiplied with a factor of 1.41 for the intrinsic bandwidth of the EA modulator 22.

Figure 9:
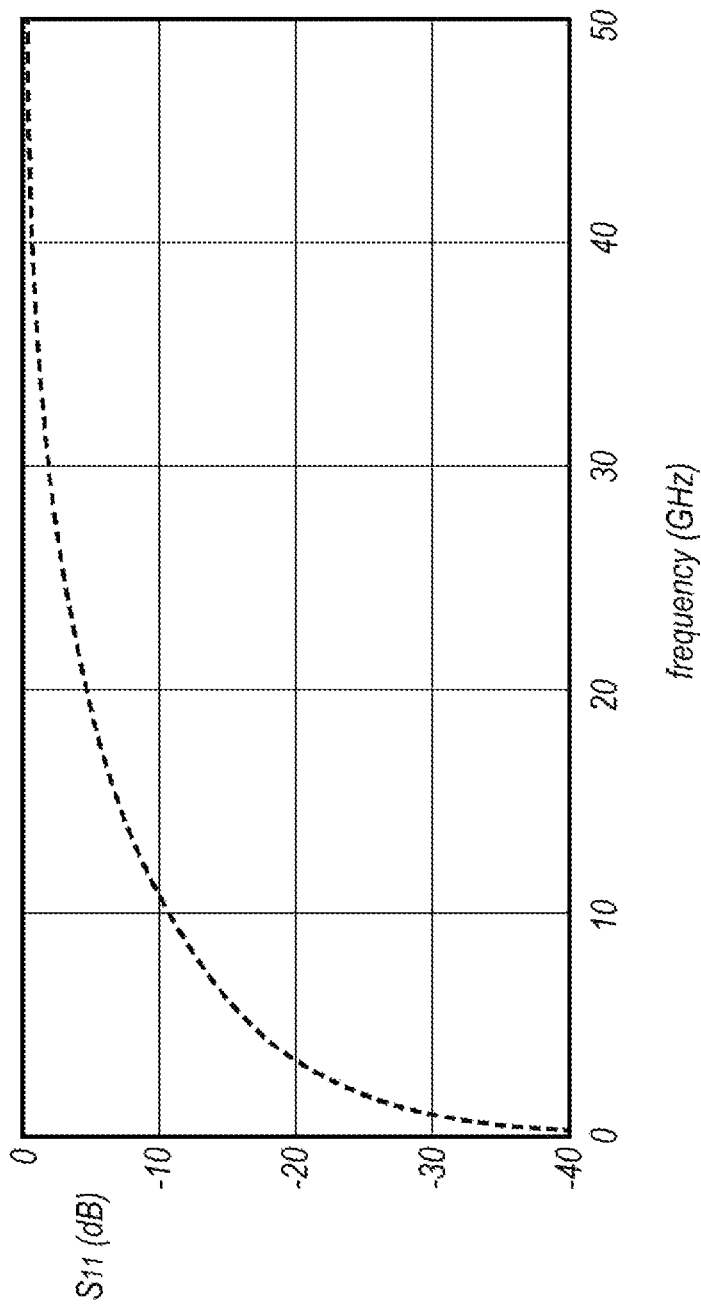
FIG. 9 shows an S-parameter $S_{11}$ viewing the EA modulator from the transmission line in the conventional optical modulator.

FIG. 9 compares a return loss at the end of the transmission line 11 in the optical modulator 10 of the first embodiment with that of the conventional optical modulator 100, where the vertical axis denotes an S-parameter $S_{11}$ in the unit of decibel (dB) that corresponds to the return loss, while, the horizontal axis shows the frequency. The return loss may be given by an equation (13) in FIG. 19.

As shown in FIG. 9, because the conventional optical modulator 100 hides appearance of the junction capacitance $C_{EA}$ by the bonding wires, 141 and 142; the optical modulator 100 shows substantial impedance matching comparing with an arrangement of no bonding wires, 141 and 142. However, the return loss $S_{11}$ exceeds −10 dB in frequencies higher than 11 GHz. An advanced optical communication system with the transmission capacity of 400 G, which is currently under development, implements an optical signal with a symbol rate (modulation speed) of 53 Gbaud/sec, which means that a fundamental frequency thereof becomes 26.5 GHz. The conventional optical modulator 100, as shown in FIG. 9, shows the return loss $S_{11}$ of about −3 dB at 26.5 GHz, which means that almost a half of power input to the optical modulator is reflected at the end of the transmission line 11.

On the other hand, the optical modulator 10 of the first embodiment, the inductors, 41 and 42, in the coil element 14 may match the input impedance $Z_{in}(s)$ at the end of the transmission line 11 completely with the impedance $R_T$ of the terminator 13. Accordingly, the return loss $S_{11}$ becomes theoretically negative infinite, which is not shown in FIG. 9. Practically, the bonding wire 15 has variation in a length thereof, geometric asymmetry between the two inductors, 41 and 42, and so on causes the return loss $S_{11}$ but the magnitude thereof is small enough.

Figure 10:
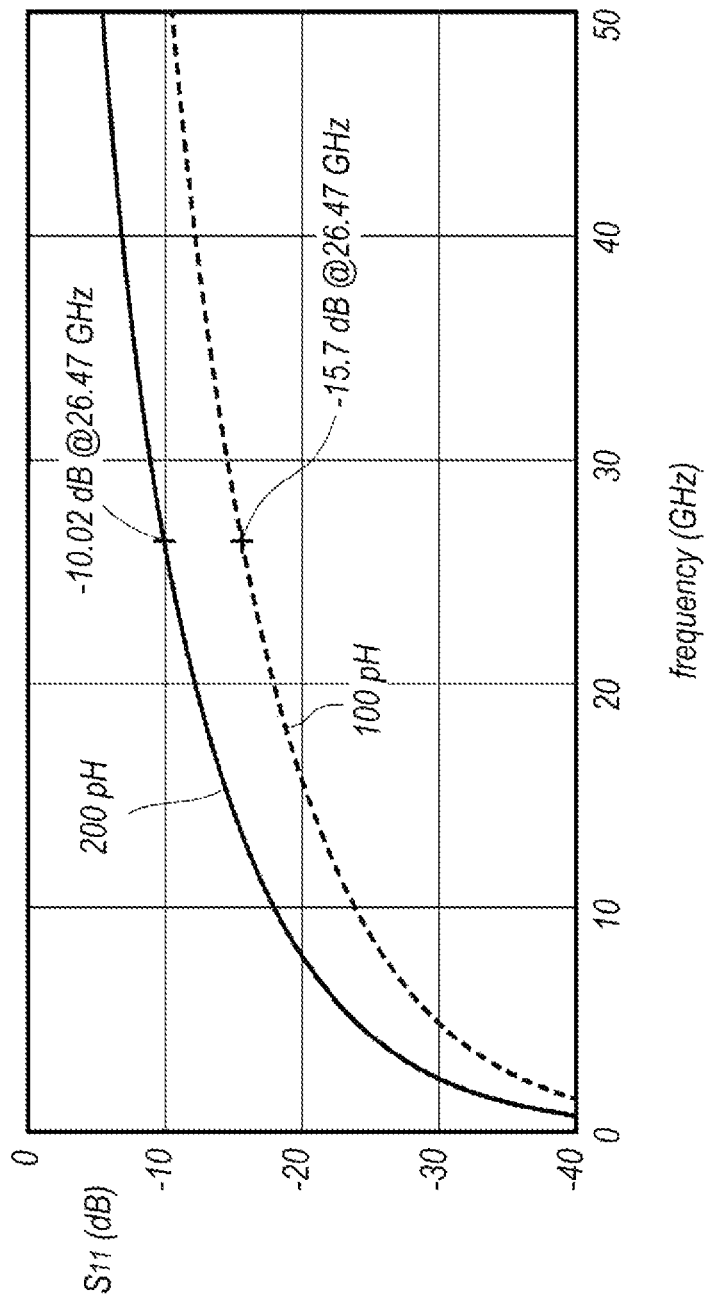
FIG. 10 shows an S-parameter $S_{11}$ of the driver where an inductor is provided in an output thereof.
Figure 11:
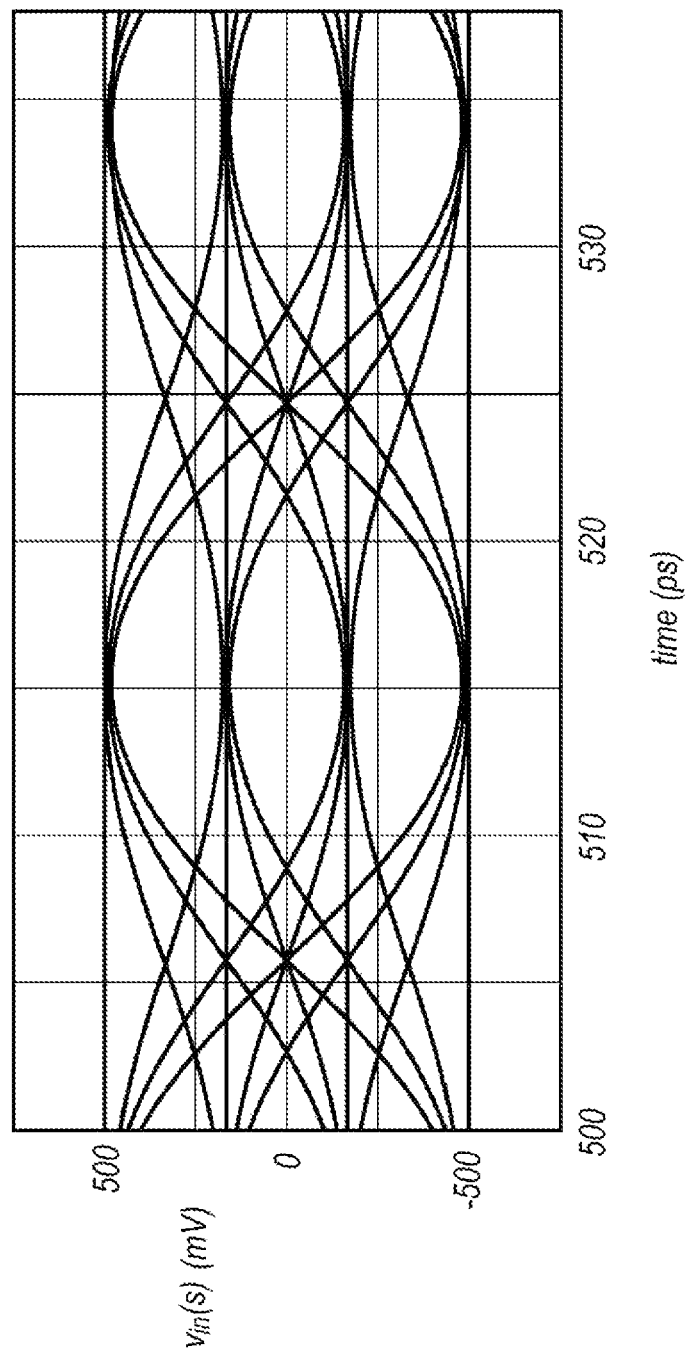
FIG. 11 shows an eye diagram of an electrical signal modulated by a four-level pulse amplitude modulation (PAM4) system at a transmission speed of 53 GBaud/sec.
Figure 12A:
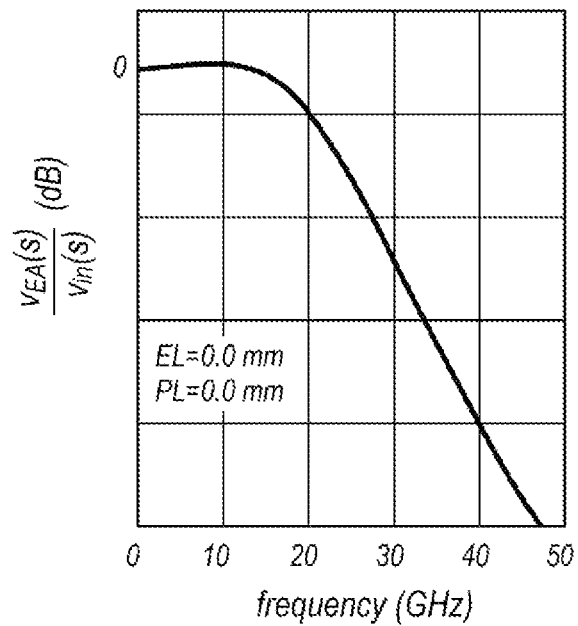
FIG. 12A to FIG. 12D show frequency responses of the modulation signal in the conventional optical modulator as varying electrical lengths of the transmission line 11 from 0 to 3 mm when the modulation signal is monitored at the EA modulator.
Figure 12B:
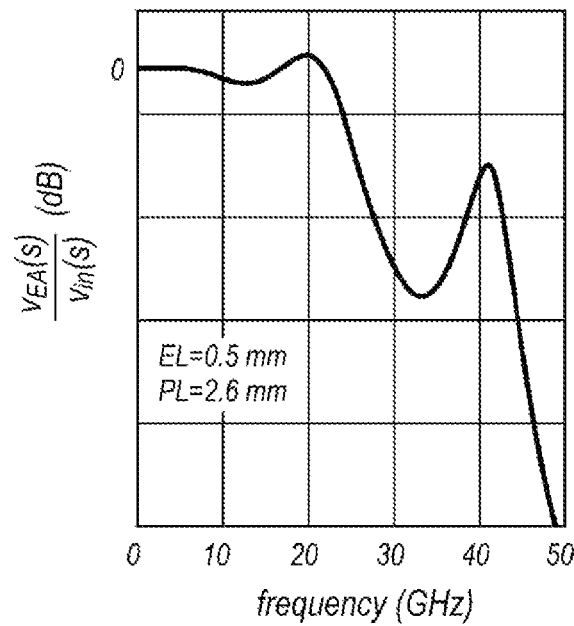
Figure 12C:
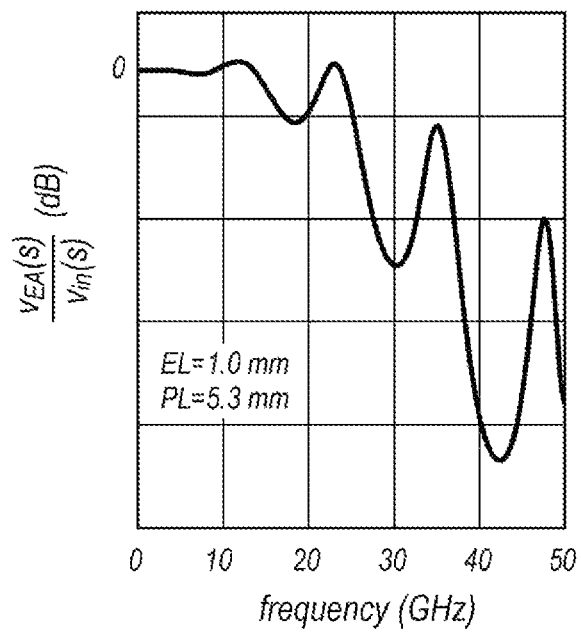
Figure 12D:
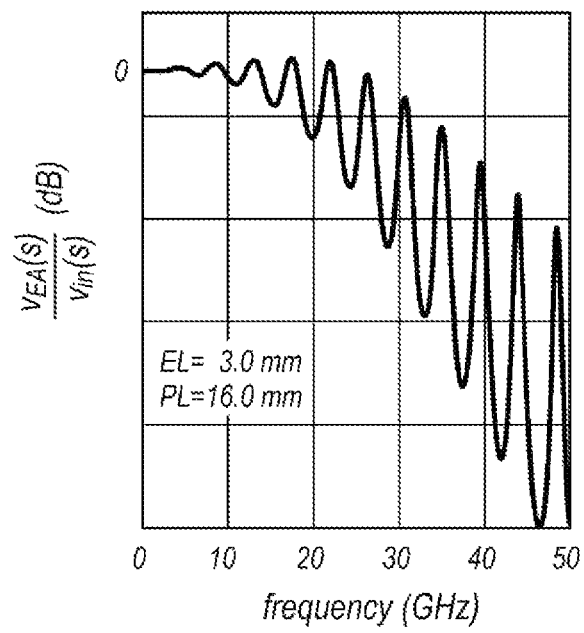
Figure 13A:
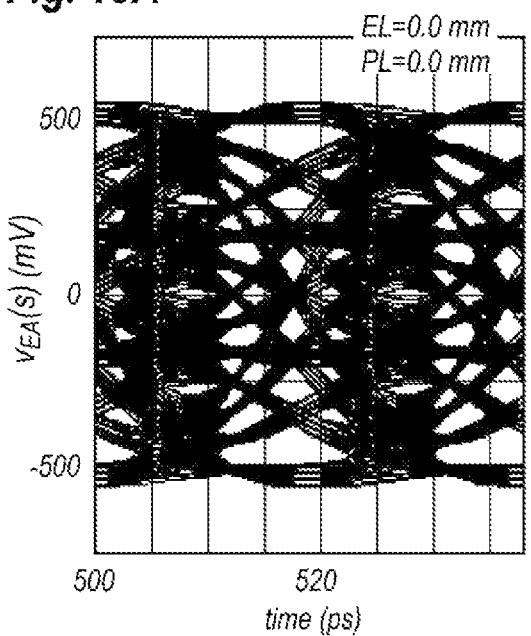
FIG. 13A to FIG. 13D show eye diagrams of the modulation signal with the waveform shown in FIG. 11 in the conventional optical modulator as varying electrical lengths of the transmission line from 0 to 3 mm when the eye diagrams are monitored at the EA modulator.
Figure 13B:
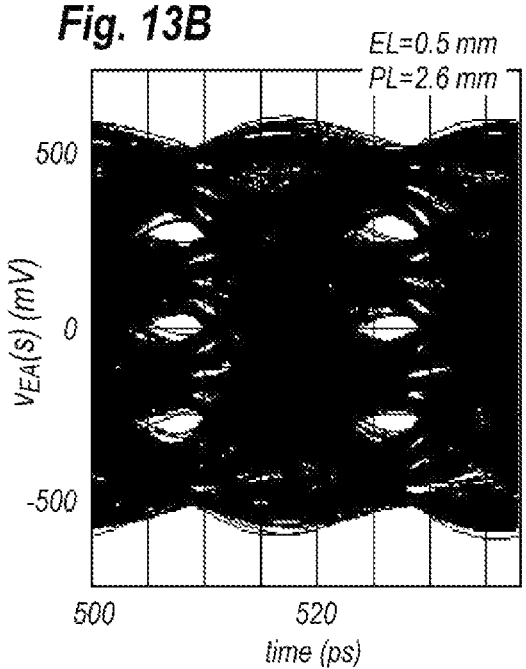
Figure 13C:
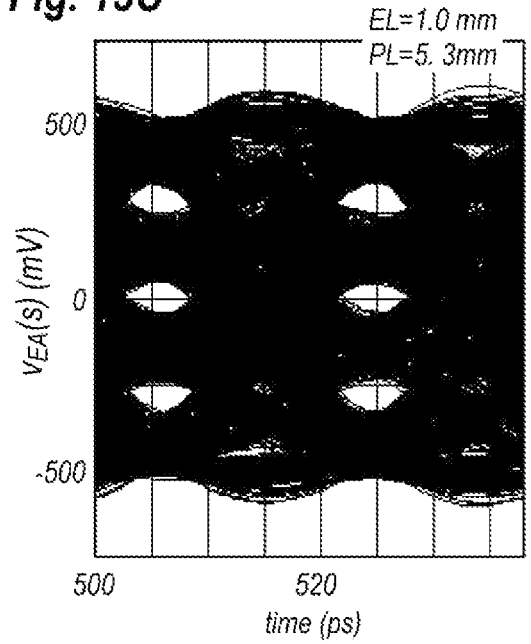
Figure 13D:
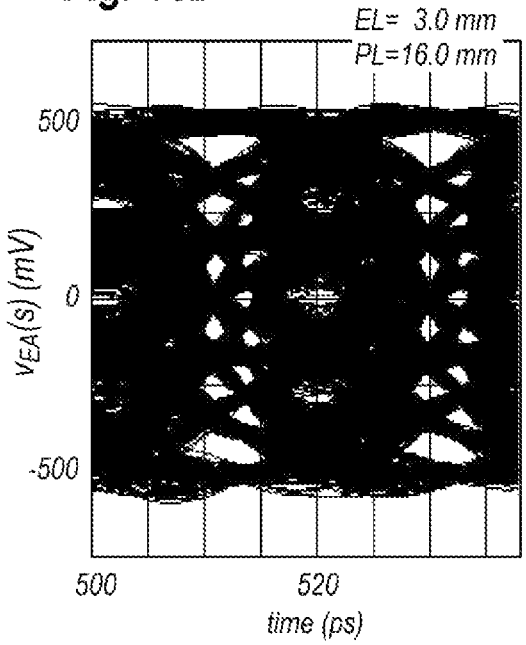
Figure 14A:
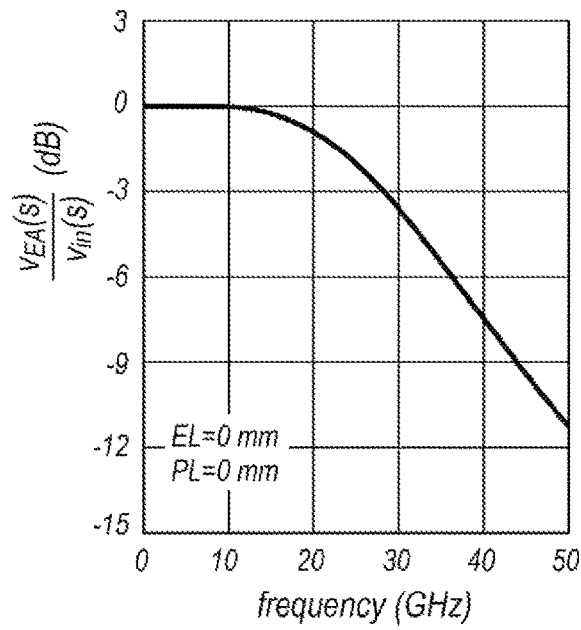
FIG. 14A to FIG. 14D show frequency responses of the modulation signal in the optical modulator of the first embodiment as varying electrical lengths of the transmission line 11 from 0 to 3 mm when the eye diagrams are monitored at the EA modulator.
Figure 14B:
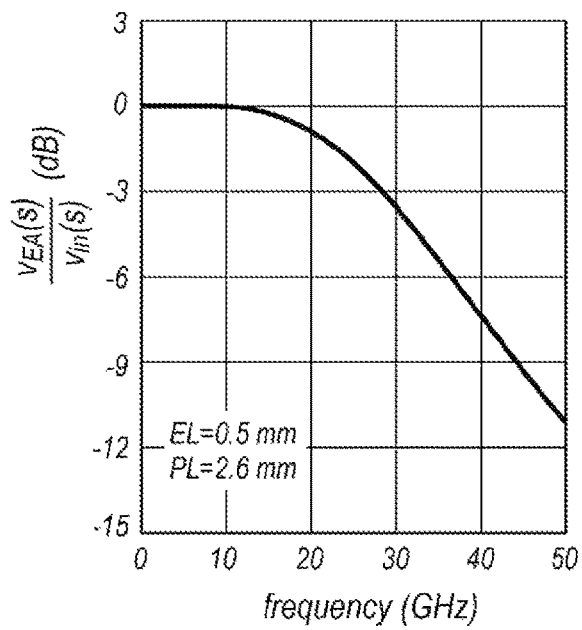
Figure 14C:
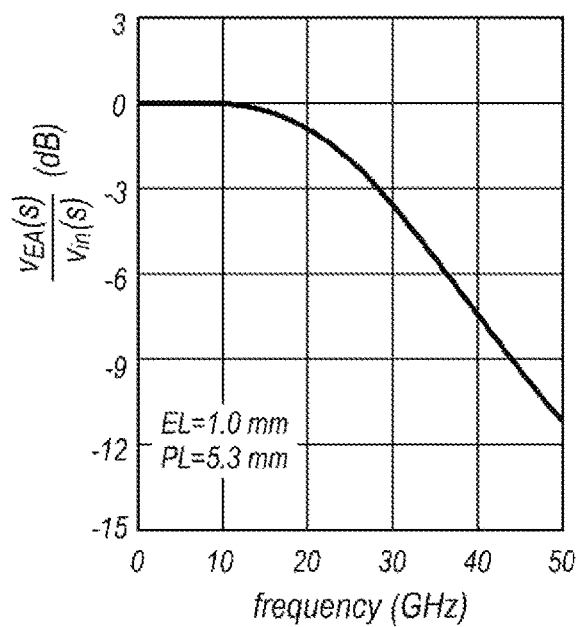
Figure 14D:
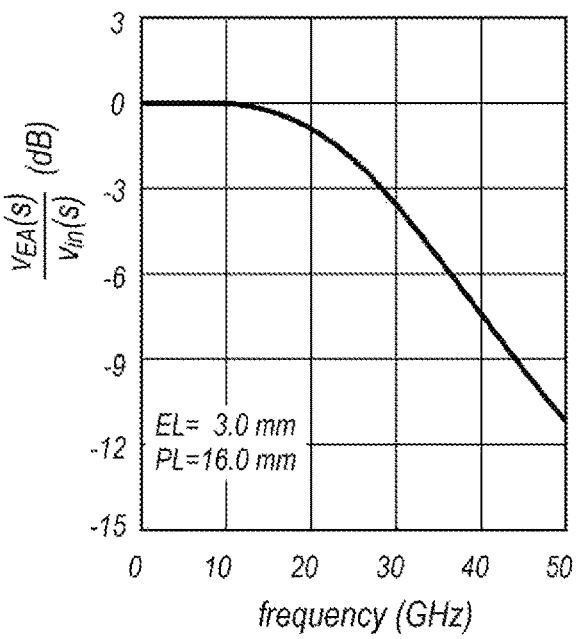
Figure 15A:
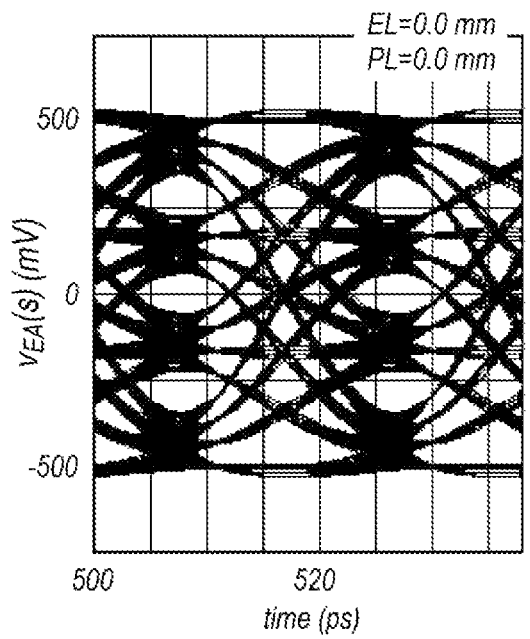
FIG. 15A to FIG. 15D show eye diagrams of the modulation signal with the waveform shown in FIG. 11 in the optical modulator of the first embodiment as varying electrical lengths of the transmission line from 0 to 3 mm when the eye diagrams are monitored at the EA modulator.
Figure 15B:
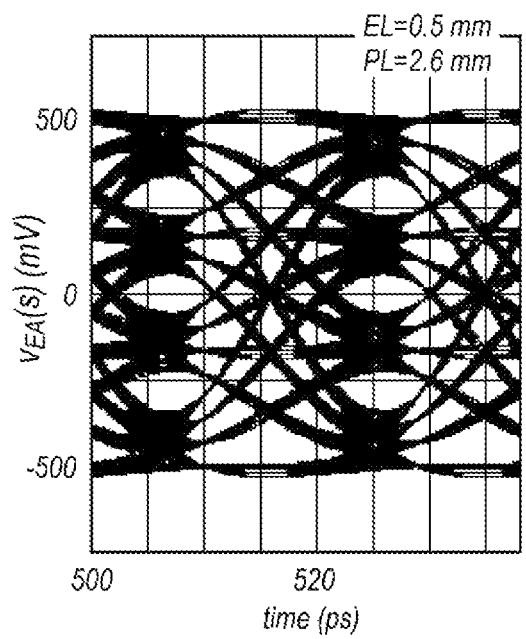
Figure 15C:
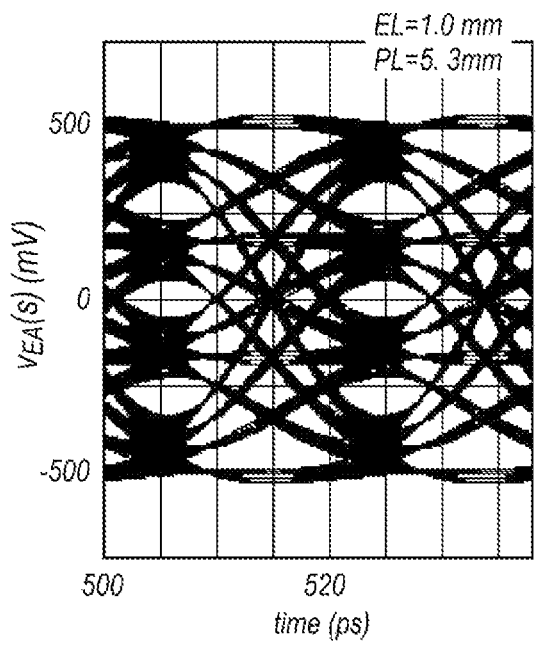
Figure 15D:
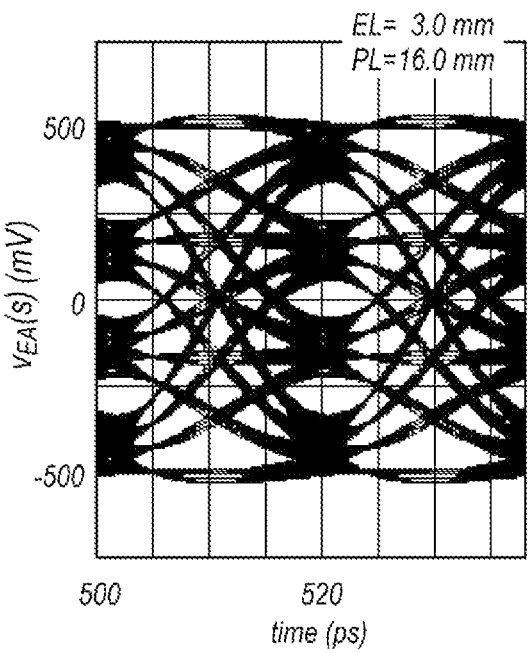

FIG. 10 shows reflection performance of the optical modulator module, and FIG. 11 shows an example of a modulation signal $v_{in}(s)$ for the EA modulator 22 that has a configuration of 4-level pulse-amplitude modulation (PAM4) with a speed of 53 Gbaud/sec. FIG. 12A to FIG. 12D show frequency responses of the modulation signal $v_{EA}(s)$ and FIG. 13A to FIG. 13D show eye diagrams thereof monitored at the EA modulator 22 each for the conventional optical modulator 100 as varying electrical lengths (ELs) of the transmission line 11 from 0 to 3 mm. On the other hand, FIG. 14A to FIG. 14D show frequency responses of the modulation signal $v_{EA}(s)$ and FIG. 15A to FIG. 15D show eye diagrams thereof for the PAM4 signal shown in FIG. 11 each monitored at the EA modulator 22 in the optical modulator 10 of the first embodiment shown in FIG. 1 as varying the electrical length of the transmission line 11 from 0 to 3 mm. Eye diagrams in FIG. 13A to FIG. 13D and FIG. 15A to FIG. 15D are shown in the vertical axes thereof by a unit of voltage, while, frequency responses in FIG. 12A to FIG. 12D and FIG. 14A to FIG. 14D are shown also in the vertical axes thereof by ratios against the modulation signal $v_{in}(s)$ at the end of the transmission line 11.

In the calculation, the electrical lengths (ELs) of 0 and 0.5 mm assumed that the optical modulators, 10 and 100, implement the driver 2 therein without transmission lines, $TL_1$ and $TL_2$; while, the electrical length of 3.0 mm assumed that the optical modulators, 10 and 100, were driven by an externally provided driver 2. Also, the electrical lengths of 0, 0.5, 1.0, and 3.0 mm corresponded to physical lengths (PLs) of 0, 2.6, 5.4, and 16 mm of the transmission lines, 11, $TL_1$, and $TL_2$, connected in series on a substrate made of glass-epoxy as a micro strip line. Besides, the optical modulator 10 assumed that the self-inductance $L_{in}$ of the inductor 41 was equal to the self-inductance $L_{out}$ of the other inductor 42.

Behaviors shown in FIG. 10 were calculated based on an arrangement where the driver 2 in the output thereof was attributed with an inductor whose inductance was 100 pH and 200 pH. At the frequency 26.5 GHz, which is the fundamental frequency for the transmission speed of 53 Gbaud/sec, the losses were −10 dB and −15.7 dB for the inductance of 100 pH and 200 pH, respectively. Because of the output characteristic of the driver 2, the optical modulator 100 caused multiple reflections on the transmission line 11 depending on an electrical length EL thereof. The multiple reflections degrade the waveforms of the modulation signal at the EA modulator 22. Specifically, as shown in FIG. 12A to FIG. 12D, the modulation signal in the frequency response $v_{EA}(s)/v_{in}(s)$ thereof degraded depending on the electrical length EL of the transmission line 11. Except the case that the transmission line 11 was virtually removed, namely EL=0 mm, the frequency response of the modulation signal $v_{EA}(s)$ indicated maxima and minima due to the inductor with the inductance of 200 pH put in the output of the driver 2. As the transmission line 11 had a longer electrical length EL, a frequency span between the neighboring maxima (or neighboring minima) became narrower and a number of the maxima and the minima increased.

Eye diagrams shown in FIG. 13A to FIG. 13D corresponded to the modulation signal $v_{EA}(s)$ with the PAM4 configuration at the EA modulator 22 when the PAM4 signal shown in FIG. 11 with a speed of 53 Gbaud/sec entered the optical modulator 100 from the driver 2. In the conventional optical modulator 100, the modulation signal $v_{EA}(s)$ with the PAM4 configuration measured at the EA modulator 22 closed and opened eyes depending on the electrical lengths of the transmission line 11.

On the other hand, as shown in FIG. 14A to FIG. 14D, the optical modulator 10 of the first embodiment, which substantially matches the input impedance thereof so as not to cause any reflection, were free from the output conditions of the driver 2, namely, the output impedance thereof. Accordingly, the electrical length EL of the transmission line 11 caused no influence in the frequency response and the eye diagrams shown in FIG. 15A to FIG. 15D. The eye diagrams may always show an enough opened eye.

Recent optical communication systems in the state of the art have replaced signals in the algorithm thereof from a non-return-to-zero (NRZ) to those having multiple levels. Transmitting an optical signal with the PAM4 configuration by the speed of 56 GBaud/sec, the equivalent transmission speed becomes 112 Gbit/sec for one wavelength, which means that a total transmission capacity of 400 G may be achieved when four (4) optical signals each having the PAM4 configuration and specific wavelengths different from each other are multiplexed in wavelengths thereof. Accordingly, the system that transmits an optical signal with the PAM4 configuration by the speed of 56 GBaud/sec has been eagerly desired. The multi-level transmission at 56 GBaud/sec is necessary to reduce the signal reflection at interfaces because not only the transmission speed itself becomes faster but a distance between symbols becomes ⅓ with respect to that in the NRZ algorithm. Accordingly, the optical modulator 10 of the first embodiment provides the inductor 41 between the transmission line 11 and the EA modulator 22 and another inductor 42 between the terminator 13 and the EA modulator 22, and couples the transmission line 11 with the terminator 13 by the capacitor $C_B$ in order to compensate the junction capacitance of the EA modulator 22. Besides, the inductors, 41 and 42, have the inductance so as to match the impedance viewing the coil element 14 from the transmission line 11 with the resistance, or the impedance $R_T$, of the terminator 13.

The impedance $Z_{in}(s)$ viewing the EA modulator 22 from the transmission line 11 depends on the capacitance $C_B$ of the coupling capacitor 43, and the inductance, $L_{in}$ and $L_{out}$, of the inductors, 41 and 42. In the first embodiment, the capacitance $C_B$ and the inductance, $L_{in}$ and $L_{out}$, are set such that the impedance $Z_{in}(s)$ matches with the impedance $R_T$ of the terminator 13, which means that the modulation signal $v_{in}(s)$ entering the optical modulator 10 causes substantially no reflection at the input of the coil element 14. The inductors, 41 and 42, at the tap 44 thereof is connected with the EA modulator 22, exactly, the anode 22a of the EA modulator 22, through the bonding wire 15 that causes the inductance but compensated with the mutual inductance M of the inductors, 41 and 42.

That is, the inductive coupling factor k of the two inductors, 41 and 42, may compensate the inductance $L_{EA}$ of the bonding wire 15. The 3 dB bandwidth $f_{3\ dB}$ of the EA modulator 22 may be determined by the junction capacitance $C_{EA}$ of the EA modulator 22, the inductance $L_{EA}$ of the bonding wire 15, and the inductive coupling factor k between the two inductors, 41 and 42. Thus, not only the inductive coupling factor k but the bonding wire 15, specifically, a length of the bonding wire 15, may expand the 3 dB bandwidth $f_{3\ dB}$.

The optical modulator according to the present invention is not restricted to the embodiment thus described. For instance, the two inductors, 41 and 42, are unnecessary to have an arrangement of a differential spiral inductor. Inductance thereof is selected so as to match the impedance viewing the EA modulator 22 from the transmission line 11 matches with the impedance $R_T$ of the terminator 13 is the only necessary condition.

Also, the inductors, 41 and 42, maybe directly connected with the anode 22a of the EA modulator 22 without interposing the bonding wire 15. In such an arrangement, the inductance $L_{EA}$ disappears in equations (2), (4) to (8), and (11); but mechanisms described above may be similarly applied.

Also, the analyses above assume that the two inductors, 41 and 42, have the inductance $L_T$ same with each other; but not restricted thereto. Two inductors may have inductance different from each other. Analyses may assume a ratio parameter KK that corresponds to a ratio of the inductance, $L_{in}$ and $L_{out}$, of the two inductors, 41 and 42, shown in equations, (14) and (15) in FIG. 19. When the ratio parameter KK is equal to 0.1, the inductance $L_{in}$ increase by 10% with respect to the inductance $L_T$, or the inductance $L_{out}$ decreases by 10% with respect to the inductance $L_T$.

Figure 16:
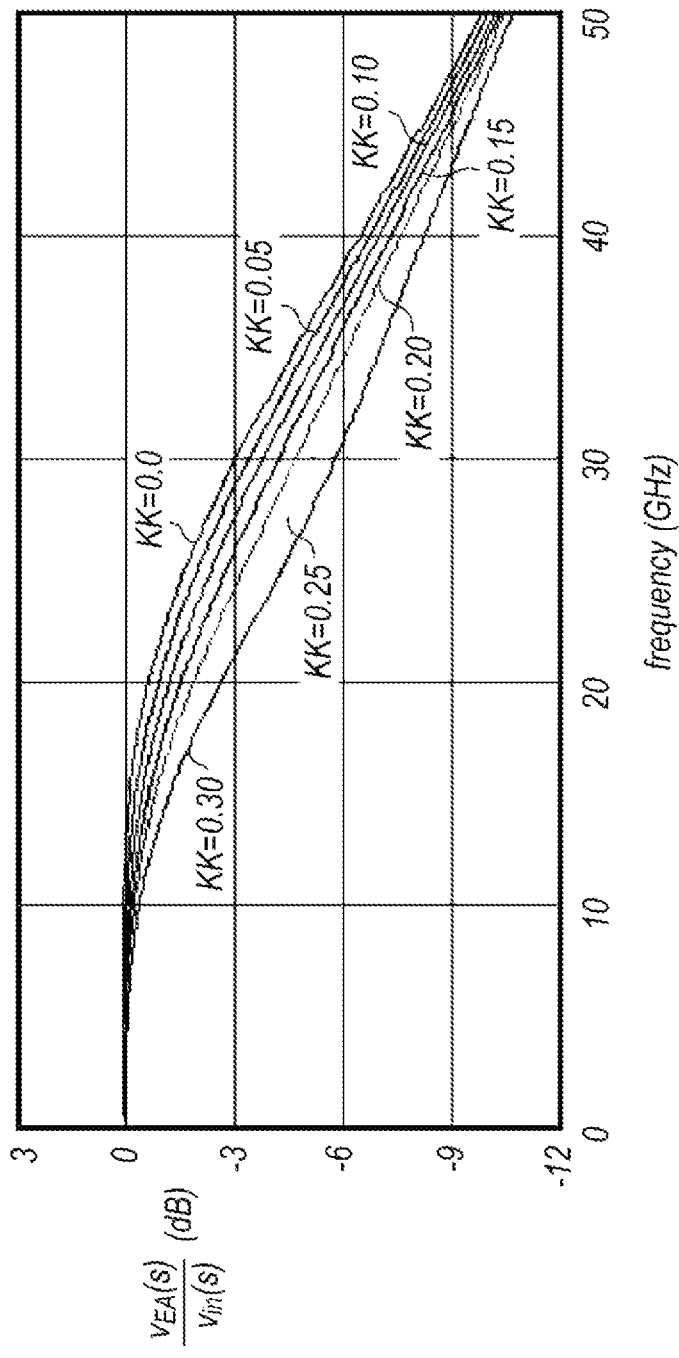
FIG. 16 shows frequency responses of the modulation signal as varying the ratio parameter KK from 0 to 0.3.
Figure 17:
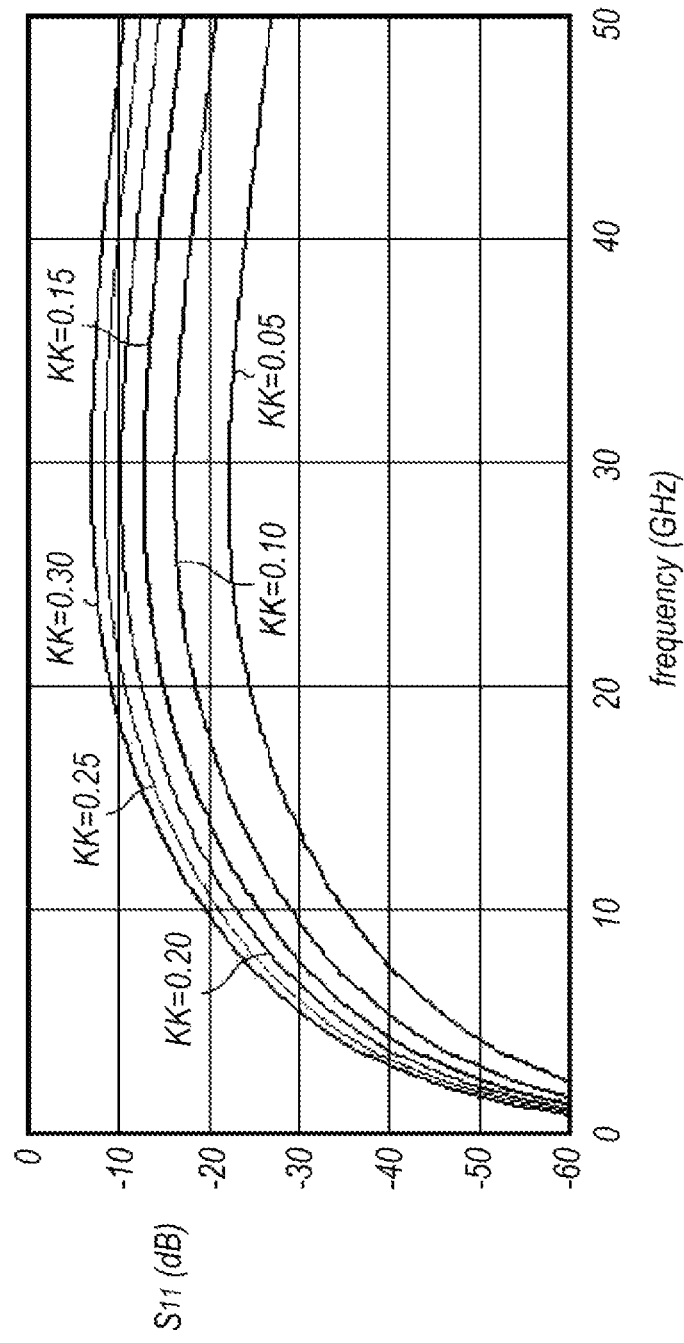
FIG. 17 shows S-parameters $S_{11}$ at the end of the transmission line as varying the ratio parameter KK from 0 to 0.3.

FIG. 16 shows frequency responses of the modulation signal $v_{EA}(s)$, while, FIG. 17 shows return losses $S_{11}$ at the end of the transmission line 11 as varying the ratio parameter KK from 0 to 0.3. The 3 dB bandwidth $f_{3\ dB}$ becomes 28 GHz and 24.2 GHz for the ratio parameter KK=0.1 and 0.2, respectively. The ratio parameter KK=0.1 gives the worst return loss of −16 dB, while, the ratio parameter KK=0.2 gives the worst return loss of −10 dB, which exceed the results obtained in the conventional optical modulator 100 shown in FIG. 7. The ratio parameter KK may be smaller than 0.1 for the modulation signal with the speed of 53 GBaud/sec taking the 3 dB bandwidth fads into account.

While particular embodiments of the present invention have been described herein for purposes of illustration, many modifications and changes will become apparent to those skilled in the art. Accordingly, the appended claims are intended to encompass all such modifications and changes as fall within the true spirit and scope of the claims of this application.

I claim:

1. An optical modulator, comprising:
   a carrier providing a multi-layer circuit board;
   a transmission line formed on the carrier and having a characteristic impedance, a first end, and a second end for transmitting an electrical signal from the first end to the second end thereof;
   a coil element formed on the carrier and having a first terminal connected to the second end of the transmission line, a second terminal, a third terminal, a first inductor connected between the first terminal and the third terminal, and a second inductor connected between the second terminal and the third terminal, the first inductor and the second inductor being magnetically coupled through mutual inductance therebetween;
   a distributed feedback laser diode (DFB-LD) provided on a substrate mounted on the carrier for generating continuous wave (CW) light;
   an electro-absorption (EA) modulator integrated on the substrate monolithically with the DFB-LD for modulating CW light from the DFB-LD in response to the electrical signal as outputted from the third terminal of the coil element; and
   a terminator formed on the carrier, the terminator having a first end connected to the second terminal of the coil element, and a second end connected to ground,
   wherein the coil element, the terminator, and the EA modulator match impedance of the coil element as viewed from the transmission line with the characteristic impedance of the transmission line.

2. The optical modulator according to claim 1,
   wherein the transmission line includes a coupling capacitor having an upstream end and a downstream end, the upstream end being connected with the first inductor, and the downstream end being connected with the second inductor and the terminator, and
   wherein the coil element, the terminator, the EA modulator, and the coupling capacitor match the impedance of the coil element as viewed from the transmission line with the characteristic impedance of the transmission line.

3. The optical modulator according to claim 2,
   wherein the transmission line has a gap that forms the coupling capacitor, the coupling capacitor being between the first terminal and the second terminal of the coil element.

4. The optical modulator according to claim 1,
   wherein the transmission line includes a coupling capacitor, and
   wherein the first inductor, the second inductor, and the coupling capacitor electrically constitute a delta connection.

5. The optical modulator according to claim 1,
   further comprising a bonding wire connecting the third terminal of the coil element with the EA modulator;
   wherein the first inductor connects the transmission line with the bonding wire, and the second inductor connects the terminator with the bonding wire.

6. The optical modulator according to claim 5,
   wherein the first inductor and the second inductor constitute a spiral inductor on the carrier, the spiral inductor having a line symmetry with respect to a virtual line along the bonding wire.

7. The optical modulator according to claim 1,
   wherein the first inductor and the second inductor constitute a spiral inductor on the carrier.

8. The optical modulator according to claim 1,
   wherein the characteristic impedance of the transmission line substantially matches the impedance of the terminator.

9. The optical modulator according to claim 1,
   wherein the first inductor and the second inductor have equal inductance.

10. The optical modulator according to claim 1,
    wherein the first inductor and the second inductor have a ratio of inductance determined by an equation of (1±KK) where KK is smaller than 0.1.

11. The optical modulator according to claim 3,
    wherein the gap forms a third end of the transmission line, the third end being apart from the second end on the carrier in a first direction along the transmission line.

12. The optical modulator according to claim 11,
    wherein the third end of the transmission line is connected to the second terminal of the coil element and the terminator.

13. The optical modulator according to claim 3,
    wherein the first terminal and the second terminal of the coil element have a space therebetween on the carrier, the space corresponding to the gap.

14. The optical modulator according to claim 1,
    wherein the coil element is located between the transmission line and the EA modulator in a second direction intersecting a first direction along the transmission line.

15. The optical modulator according to claim 1,
    wherein the carrier has ground patterns sandwiching the transmission line therebetween with a gap.

16. The optical modulator according to claim 15,
    wherein the ground patterns surround the coil element.

17. The optical modulator according to claim 5,
    wherein the carrier has ground patterns sandwiching the transmission line therebetween with a gap,
    wherein the ground patterns surround the coil element, and
    wherein the bonding wire crosses over a part of the ground patterns.

* * * * *